US009859019B1

(12) United States Patent
Hanagandi et al.

(10) Patent No.: US 9,859,019 B1
(45) Date of Patent: Jan. 2, 2018

(54) PROGRAMMABLE COUNTER TO CONTROL MEMORY BUILT IN SELF-TEST

(71) Applicant: International Business Machines Corporation, Armonk, NY (US)

(72) Inventors: Deepak I. Hanagandi, Karnataka (IN); Krishnendu Mondal, Bangalore (IN); Kiran K. Narayan, Hyderabad (IN); Michael R. Ouellette, Westford, VT (US); Michael A. Ziegerhofer, Jeffersonville, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/413,974

(22) Filed: Jan. 24, 2017

(51) Int. Cl.
*G11C 29/00* (2006.01)
*G11C 29/12* (2006.01)
*G06F 11/27* (2006.01)

(52) U.S. Cl.
CPC ........ *G11C 29/12015* (2013.01); *G06F 11/27* (2013.01)

(58) Field of Classification Search
CPC ... G11C 29/16; G11C 29/12015; G11C 29/26; G11C 2019/2602
USPC ...................................................... 365/201
See application file for complete search history.

(56) References Cited

U.S. PATENT DOCUMENTS

| | | | |
|---|---|---|---|
| 6,834,361 B2* | 12/2004 | Abbott ................... | G11C 29/26 714/42 |
| 7,178,076 B1 | 2/2007 | Zarrineh et al. | |
| 7,206,979 B1 | 4/2007 | Zarrineh et al. | |
| 7,653,845 B2* | 1/2010 | Hesse ..................... | G11C 29/16 714/718 |
| 7,656,726 B2 | 2/2010 | Cheng et al. | |
| 8,042,012 B2 | 10/2011 | Baker | |
| 8,918,690 B2* | 12/2014 | Hanagandi ....... | G11C 29/12015 714/718 |
| 9,024,650 B2 | 5/2015 | Somachudan et al. | |
| 2002/0194545 A1* | 12/2002 | Abbott ................... | G11B 20/18 714/42 |

(Continued)

FOREIGN PATENT DOCUMENTS

| EP | 1031995 A1 | 8/2000 |
|---|---|---|
| EP | 1343174 A2 | 9/2003 |

OTHER PUBLICATIONS

Boutobza et al., "Programmable Memory BIST", International Test Conference, 2005, pp. 1-10.

*Primary Examiner* — Han Yang
*Assistant Examiner* — Xiaochun L Chen
(74) *Attorney, Agent, or Firm* — Cantor Colburn LLP; Steven Meyers

(57) ABSTRACT

A system and method control an operation of a built-in self-test (BIST) of memory devices of an integrated circuit. The method includes generating count values using a program counter, and providing a first burst of instructions to the memory devices. The method also includes controlling a chip enable signal associated with each of the memory devices according to the count values during a wait period following the providing the first burst of instructions until a second burst of instructions is provided to the memory devices. The chip enable signal of each of the memory devices defines clock cycles at which the memory device is operated and clock cycles at which the memory device is idle.

20 Claims, 4 Drawing Sheets

(56) References Cited

U.S. PATENT DOCUMENTS

| | | |
|---|---|---|
| 2008/0046789 A1 | 2/2008 | Arsovski et al. |
| 2014/0189448 A1* | 7/2014 | Hanagandi ....... G11C 29/12015 714/718 |
| 2016/0224450 A1 | 8/2016 | Gorman et al. |

* cited by examiner

PROGRAMMABLE COUNTER TO CONTROL MEMORY BUILT IN SELF-TEST

BACKGROUND

The present invention relates to integrated circuit verification, and more specifically, to a programmable counter to control the memory built in self-test.

A variety of tests are implemented on integrated circuits or chips in order to verify that different aspects of the chips function properly for use by the ultimate customers. One aspect of chip functionality that is tested is the memory. Generally, a built in self-test (BIST) architecture is used and includes a BIST controller and a BIST engine to generate instructions that are implemented on the chip. A functional clock is used to clock the applied BIST instructions to be as close to the memory clock speed as possible.

SUMMARY

According to an embodiment of the present invention, a method of controlling an operation of a built-in self-test (BIST) of memory devices of an integrated circuit includes generating count values using a program counter, and providing a first burst of instructions to the memory devices. The method also includes controlling a chip enable signal associated with each of the memory devices according to the count values during a wait period following the providing the first burst of instructions until a second burst of instructions is provided to the memory devices. The chip enable signal of each of the memory devices defines clock cycles at which the memory device is operated and clock cycles at which the memory device is idle.

According to another embodiment, a system to control built-in self-test (BIST) of memory devices of an integrated circuit includes a BIST engine to provide a first burst of instructions to the memory devices, and a program counter to generate count values. A BIST input-output device associated with each respective one of the memory devices generates a chip enable signal for the memory device according to the count values during a wait period following provision of the first burst of instruction to the memory device until a second burst of instructions is provided to the memory device. The chip enable signal defines clock cycles at which the memory device is operated and clock cycles at which the memory device is idle.

A computer program product for controlling an operation of a built-in self-test (BIST) of memory devices of an integrated circuit includes a computer readable storage medium having program instructions embodied therewith. The program instructions are executable by a processor to perform a method that includes generating count values, and providing a first burst of instructions to the memory devices. The method also includes controlling a chip enable signal associated with each of the memory devices according to the count values during a wait period following the providing the first burst of instructions until a second burst of instructions is provided to the memory devices. The chip enable signal of each of the memory devices defines clock cycles at which the memory device is operated and clock cycles at which the memory device is idle.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As previously noted, memory BIST instructions are used to test chip memory. Generally, the BIST instructions are provided in parallel to all memory devices at every clock cycle. This represents the maximum demand on the on-chip memory. The power draw required for the parallel instructions executed at every memory device at every clock cycle results in on-chip noise and heat dissipation that can cause power failure. As a result, chips can fail the memory tests due to noise rather than because of any issues in the memory devices themselves. In addition, providing BIST instructions in parallel at every clock cycle is unlikely to be representative of a customer's use of the on-chip memory. Thus, the type of testing that can lead to failure due to noise can also be unrealistic. Embodiments of the systems and methods detailed herein relate to a programmable counter to control the memory BIST operation. Specifically, the programmable counter defines the cycles in which the operations on the memory are executed such that execution of instructions in parallel at every memory device at every clock cycle is not the only mode of operation. As such, testing of the memory and, consequently, through thorough testing, the operation of the memory of the integrated circuit is improved.

Figure 1:
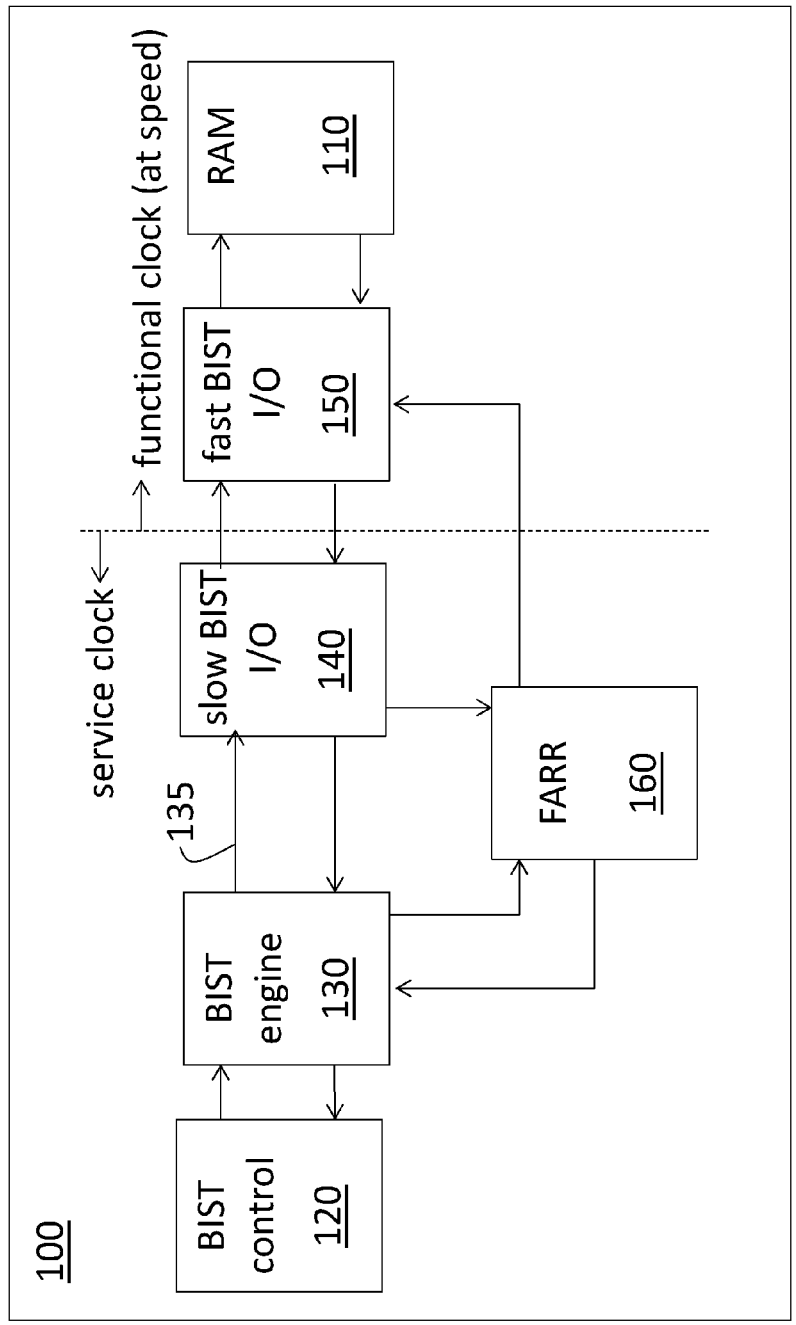
FIG. 1 is a block diagram of the built-in self-test (BIST) architecture used to test the random access memory (RAM) of a chip according to one or more embodiments.

FIG. 1 is a block diagram of the BIST architecture used to test the random access memory (RAM 110) of a chip 100 according to one or more embodiments. A BIST controller 120 drives a BIST engine 130 to generate instructions 135 for implementation by a RAM 110. FIG. 1 includes a dashed line that delineates components that run on a service clock (e.g., 50 to 250 megahertz (MHz)) and those that run on a functional clock, which is faster than the service clock and matches the clock speed at which the RAM 110 is operated. A slow BIST input/output (I/O) device 140 receives the instructions 135 and provides them to a fast BIST I/O device 150 that applies the instructions 135 at functional clock speed to the RAM 110. For explanatory purposes, one fast BIST I/O device 150 and associated RAM 110 are shown in FIG. 1. A chip 100 typically includes a fast BIST I/O device 150 associated with each RAM 110 memory device to be tested. A failing address and repair register (FARR) 160 collects memory addresses that fail the test that is executed based on the instructions 135.

In prior systems, the BIST engine 130 broadcasts a burst of instructions (e.g., 4 instructions) through the slow BIST I/O device 140 to the fast BIST I/O device 150. The fast BIST I/O device 150 sends the burst of instructions to the RAM 110 at the functional clock speed. The fast BIST I/O device 150 then sends a handshake signal to the BIST engine 130, which prompts the BIST engine 130 to start sending the next burst of instructions. During the time that the BIST engine 130 is generating the next burst of instructions, the fast BIST I/O device 150 repeatedly sends the last instruction in the previous burst of instructions to the RAM 110. This is what results in instructions being provided at each clock cycle.

According to one or more embodiments, the BIST engine 130 includes a programmable counter 310 that defines the cycles in which the operations on the RAM 110 are executed. Specifically, during the wait period while the BIST engine 130 is generating the next burst of instructions 135, the fast BIST I/O device 150 does not repeat the last instruction 135 from the previous burst of instructions 135 until the programmed count has been reached. After the fast BIST I/O device 150 has applied the previous burst of instructions 135, the chip enable (CE) signal 230 (FIG. 2) to the RAM 110 is held low and memory is in an idle state until the programmed count has been reached. As such, the programmable counter prevents operation of the RAM 110 at every clock cycle.

Figure 2:
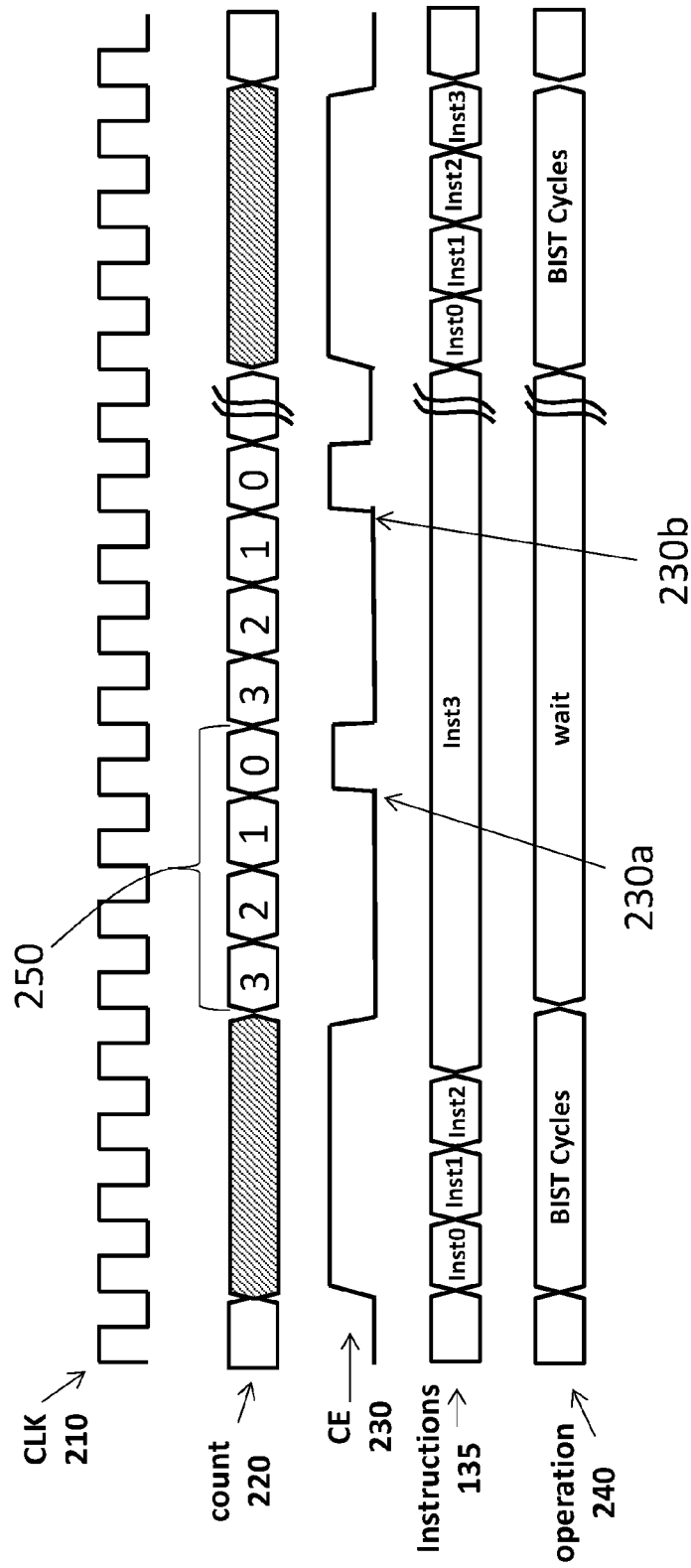
FIG. 2 is an exemplary timing diagram associated with control of memory BIST according to one or more embodiments.

FIG. 2 is an exemplary timing diagram associated with control of memory BIST according to one or more embodiments. The functional clock (CLK) signal 210 that is provided to the fast BIST I/O device 150 is shown. The count value 220, which is controlled by the program counter 310 (FIG. 3) is also shown. The CE signal 230 indicates when instructions 135 are provided by the fast BIST I/O device 150 to the RAM 110, and the corresponding status or operation 240 at each clock cycle is also indicated. As FIG. 2 shows, the program counter 310 imposes an exemplary delay 250 of four counts between CE signals 230 during the period when the BIST engine 130 is generating a next burst of instructions 135. That is, the CE signal 230 is held low for three consecutive count values 220 and the count is restarted after four count values 220 if a new burst of instructions 135 has not been issued by the BIST engine 130. Thus, the last instruction 135 in the previous burst (inst3) is resent for CE signals 230a and 230b (i.e., at every fourth clock cycle) during the period when the operation 240 indicates the "wait," but inst3 is not resent at every clock cycle during this period. As a result the RAM 110 is not operated at every clock cycle and the associated issue of noise in the power supply can be avoided.

Figure 3:
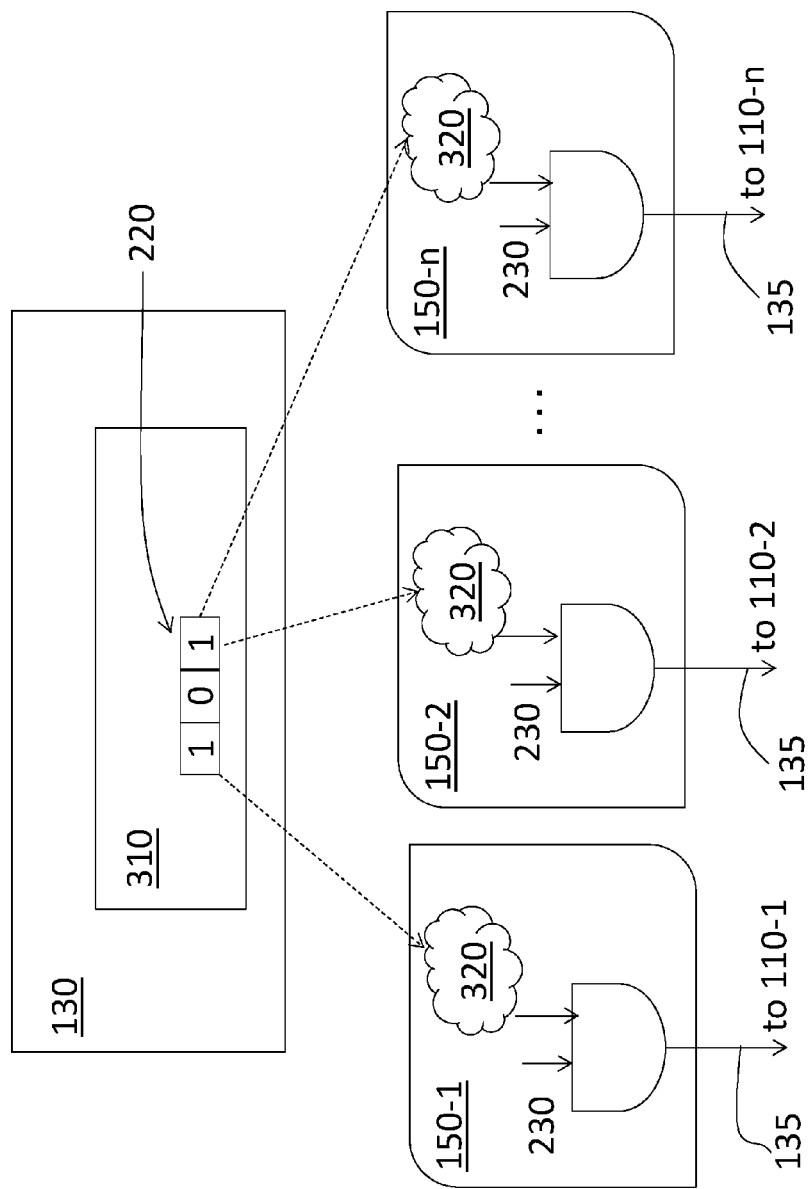
FIG. 3 details control of the memory BIST according to an embodiment.

FIG. 3 details control of the memory BIST according to an embodiment. As previously noted, each RAM 110 to be tested is associated with a fast BIST I/O device 150. According to the embodiment shown in FIG. 3, the program counter 310 generates the same count value 220 to be sent to each of multiple fast BIST I/O devices 150-1 through 150-n. In accordance with the configuration shown in FIG. 1, the output from the program counter 310 of the BIST engine 130 goes to each fast BIST I/O device 150 through the slow BIST I/O device 140, although the slow BIST I/O devices 140 are not shown. In alternate embodiments, the output from the program counter 310 of the BIST engine 130 can be provided directly to the fast BIST I/O device 150.

At each fast BIST I/O device 150, the count value 220 provided by the program counter 310 and the corresponding CE signal 230 are used to generate the instruction 135 to the corresponding RAM 110. Because the count value 220 is the same at each fast BIST I/O device 150, the corresponding CE signal 230 is also the same at east fast BIST I/O device. The count value 220 is processed according to processing 320 at each fast BIST I/O device 150. The processing 320 can include a finite state machine (FSM). The exemplary count values 220 shown in FIG. 3 indicate that the CE signal 230 will be held high for one clock cycle out of every three clock cycles during the wait period when the BIST engine 130 is generating the next burst of instructions 135 for processing by the RAM 110-1 through 110-n. Because the same count value 220 is provided to each of the RAM 110-1 through 110-n, all the RAM 110 will be in the same operational state (i.e., all will be idle or processing instructions 135).

Figure 4:
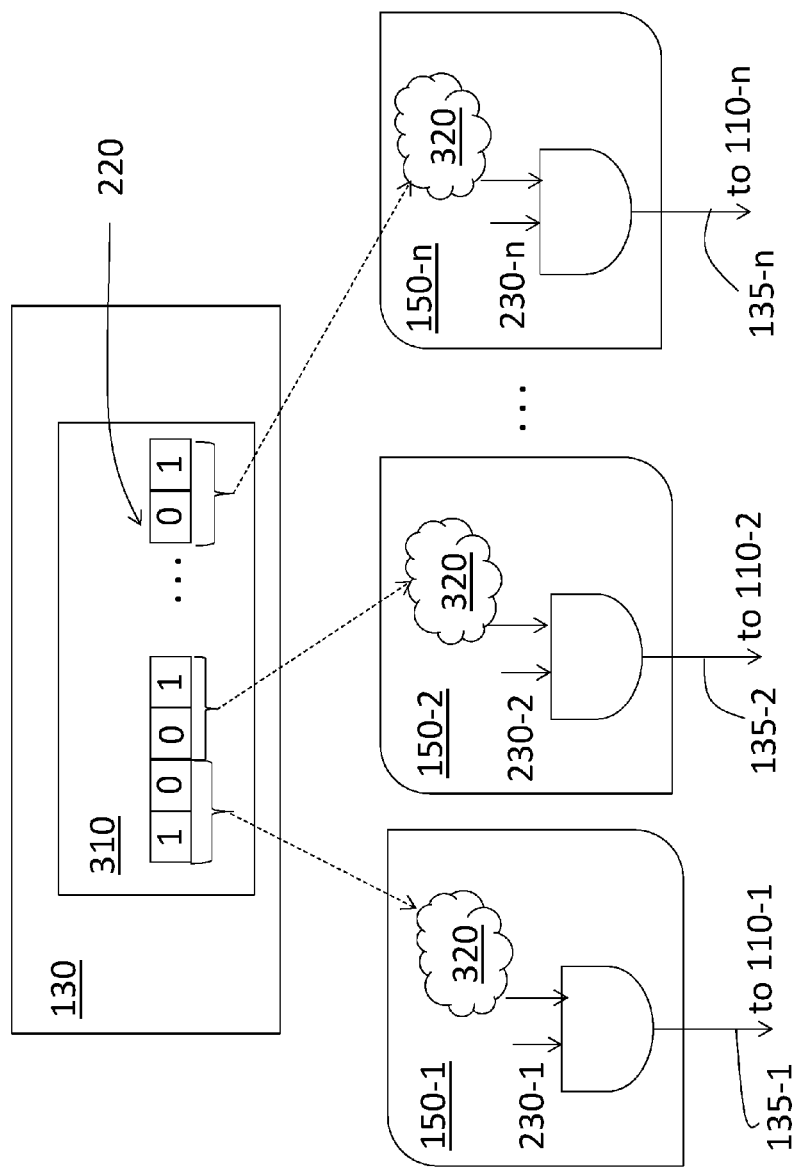
FIG. 4 details control of the memory BIST according to another embodiment.

FIG. 4 details control of the memory BIST according to another embodiment. According to the embodiment shown in FIG. 4, the program counter 310 generates different count values 220 to be sent to each of multiple fast BIST I/O devices 150-1 through 150-n. Again, while only the BIST engine 130 and fast BIST I/O devices 150 are shown, the output of the BIST engine 130 can reach the fast BIST I/O devices 150 through slow BIST I/O devices 140 according to one or more embodiments.

Because the count value 220 associated with each fast BIST I/O device 150 can be different, the corresponding CE signal 230 associated with each fast BIST I/O device 150 can also be different. Thus, while one RAM 110-1 is idle, another RAM 110-2 can be processing instructions 135, for example. In the exemplary case shown in FIG. 4, the delay imposed by the program counter 310 is one clock cycle (i.e., every alternating count value 220 is zero). Thus, there are only two possibilities for count values 220 during the wait period for any fast BIST I/O device 150. For example, as shown in FIG. 4, fast BIST I/O devices 150-2 and 150-n are supplied with identical count values 220. When a longer sequence of count values 220 is issued by the program counter 310, the difference in count values 220 (i.e., number of possible combinations) provided to the fast BIST I/O devices 150 is increased. As a result, the instruction 135 provided to each fast BIST I/O device 150 at a given clock cycle can be different, as well.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of controlling an operation of a built-in self-test (BIST) of memory devices of an integrated circuit, the method comprising:
    generating count values using a program counter;
    providing a first burst of instructions to the memory devices;
    controlling a chip enable signal associated with each of the memory devices according to the count values during a wait period following the providing the first burst of instructions until a second burst of instructions is provided to the memory devices, wherein the chip enable signal of each of the memory devices defines clock cycles at which the memory device is operated and clock cycles at which the memory device is idle.

2. The method according to claim 1, wherein the providing the first burst of instructions includes providing one of the first burst of instructions at each consecutive clock cycle.

3. The method according to claim 1, wherein the generating the count values includes generating one set of the count values.

4. The method according to claim 3, wherein the controlling the chip enable signal includes generating a same chip enable signal associated with the one set of the count values for all of the memory devices.

5. The method according to claim 1, wherein the generating the count values includes generating a different set of the count values to correspond with each of the memory devices.

6. The method according to claim 5, wherein the controlling the chip enable signal includes generating a chip enable signal associated with the different set of the count values, respectively, to correspond with each of the memory devices.

7. A system to control built-in self-test (BIST) of memory devices of an integrated circuit, the system comprising:
    a BIST engine configured to provide a first burst of instructions to the memory devices;
    a program counter configured to generate count values;
    a BIST input-output device associated with each respective one of the memory devices and configured to generate a chip enable signal for the memory device according to the count values during a wait period following provision of the first burst of instruction to the memory device until a second burst of instructions is provided to the memory device, wherein the chip enable signal defines clock cycles at which the memory device is operated and clock cycles at which the memory device is idle.

8. The system according to claim 7, wherein each BIST input-output device provides each instruction of the first burst of instructions to the memory device at each consecutive clock cycle.

9. The system according to claim 7, further comprising a failing address and repair register (FARR) configured to store addresses of any of the memory devices associated with a failure.

10. The system according to claim 7, further comprising a slow BIST input-output device configured to run at a slower clock speed than the BIST input-output device and relay the count values from the program counter to the BIST input-output device.

11. The system according to claim 7, wherein the program counter generates one set of the count values.

12. The system according to claim 11, wherein the chip enable signal associated with each of the memory devices is a same chip enable signal.

13. The system according to claim 7, wherein the program counter generates a different set of the count values to correspond with each of the memory devices.

14. The system according to claim 13, wherein the chip enable signal associated with each of the memory devices corresponds with a respective one of the different set of the count values.

15. A computer program product for controlling an operation of a built-in self-test (BIST) of memory devices of an integrated circuit, the computer program product comprising a computer readable storage medium having program instructions embodied therewith, the program instructions executable by a processor to perform a method comprising:
    generating count values;
    providing a first burst of instructions to the memory devices;
    controlling a chip enable signal associated with each of the memory devices according to the count values during a wait period following the providing the first burst of instructions until a second burst of instructions is provided to the memory devices, wherein the chip enable signal of each of the memory devices defines clock cycles at which the memory device is operated and clock cycles at which the memory device is idle.

16. The computer program product according to claim 15, wherein the providing the first burst of instructions includes providing one of the first burst of instructions at each consecutive clock cycle.

17. The computer program product according to claim 15, wherein the generating the count values includes generating one set of the count values.

18. The computer program product according to claim 17, wherein the controlling the chip enable signal includes generating a same chip enable signal associated with the one set of the count values for all of the memory devices.

19. The computer program product according to claim 15, wherein the generating the count values includes generating a different set of the count values to correspond with each of the memory devices.

20. The computer program product according to claim 19, wherein the controlling the chip enable signal includes generating a chip enable signal associated with the different set of the count values, respectively, to correspond with each of the memory devices.

* * * * *